US011919264B2

(12) United States Patent
Jiang et al.

(10) Patent No.: US 11,919,264 B2
(45) Date of Patent: Mar. 5, 2024

(54) METHOD OF PRINTING AND IMPLEMENTING REFRACTIVE X-RAY OPTICAL COMPONENTS

(71) Applicant: UCHICAGO ARGONNE, LLC, Chicago, IL (US)

(72) Inventors: Zhang Jiang, Naperville, IL (US); Miaoqi Chu, Willowbrook, IL (US); Jin Wang, Hinsdale, IL (US); Michael J. Pellin, Naperville, IL (US); Prabhjot Mehta Menon, Palatine, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 303 days.

(21) Appl. No.: 17/039,624

(22) Filed: Sep. 30, 2020

(65) Prior Publication Data

US 2022/0097327 A1    Mar. 31, 2022

(51) Int. Cl.
*B29D 11/00* (2006.01)
*G02B 3/00* (2006.01)
*G03F 7/00* (2006.01)
*G21K 1/06* (2006.01)

(52) U.S. Cl.
CPC .. *B29D 11/00365* (2013.01); *B29D 11/00403* (2013.01); *G02B 3/0012* (2013.01); *G03F 7/001* (2013.01); *G21K 1/065* (2013.01); *G21K 2201/067* (2013.01)

(58) Field of Classification Search
CPC ........ B29D 11/00365; B29D 11/00403; G21K 1/065; G03F 7/001; G02B 3/0012
See application file for complete search history.

(56) References Cited

U.S. PATENT DOCUMENTS

| | | | |
|---|---|---|---|
| 5,969,864 A | 10/1999 | Chen et al. | |
| 6,269,145 B1 | 7/2001 | Piestrup et al. | |
| 6,674,583 B2 | 1/2004 | Beguiristain et al. | |
| 9,027,221 B2 | 5/2015 | Le et al. | |
| 2014/0013573 A1 | 1/2014 | Le et al. | |
| 2020/0398509 A1* | 12/2020 | Sanli | B29D 11/00365 |

FOREIGN PATENT DOCUMENTS

RU         2692405    *  6/2019
WO    WO-2019/170399 A1   9/2019

* cited by examiner

*Primary Examiner* — Mathieu D Vargot
(74) *Attorney, Agent, or Firm* — MARSHALL, GERSTEIN & BORUN LLP

(57) ABSTRACT

A method of fabricating a refractive optical element on a substrate may provide less expensive and more compact optics for an X-ray system. The method includes coating the substrate with a resin and providing radiation to a portion of the resin to cause two photon polymerization of the resin. The method further includes forming, by two photon polymerization, a first surface of a polymer refractive optical element from the resin. The first surface is disposed along an optical axis of the refractive optical element and the first surface has a roughness of less than 100 nanometers. Further, the method includes forming, by two photon polymerization, a second surface of the polymer refractive optical element. The second surface is disposed along the optical axis of the refractive optical element and the second surface has a roughness of less than 100 nanometers.

20 Claims, 12 Drawing Sheets

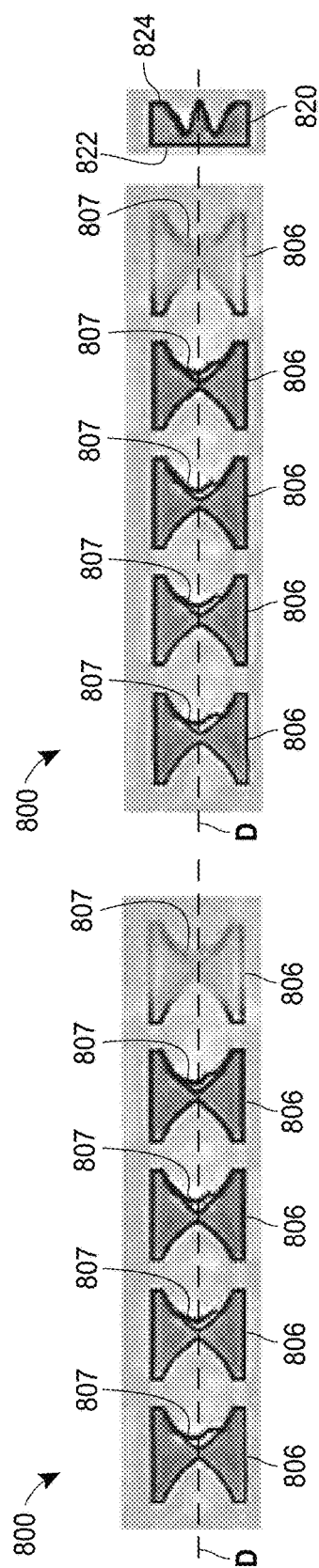
FIG. 8A
FIG. 8C
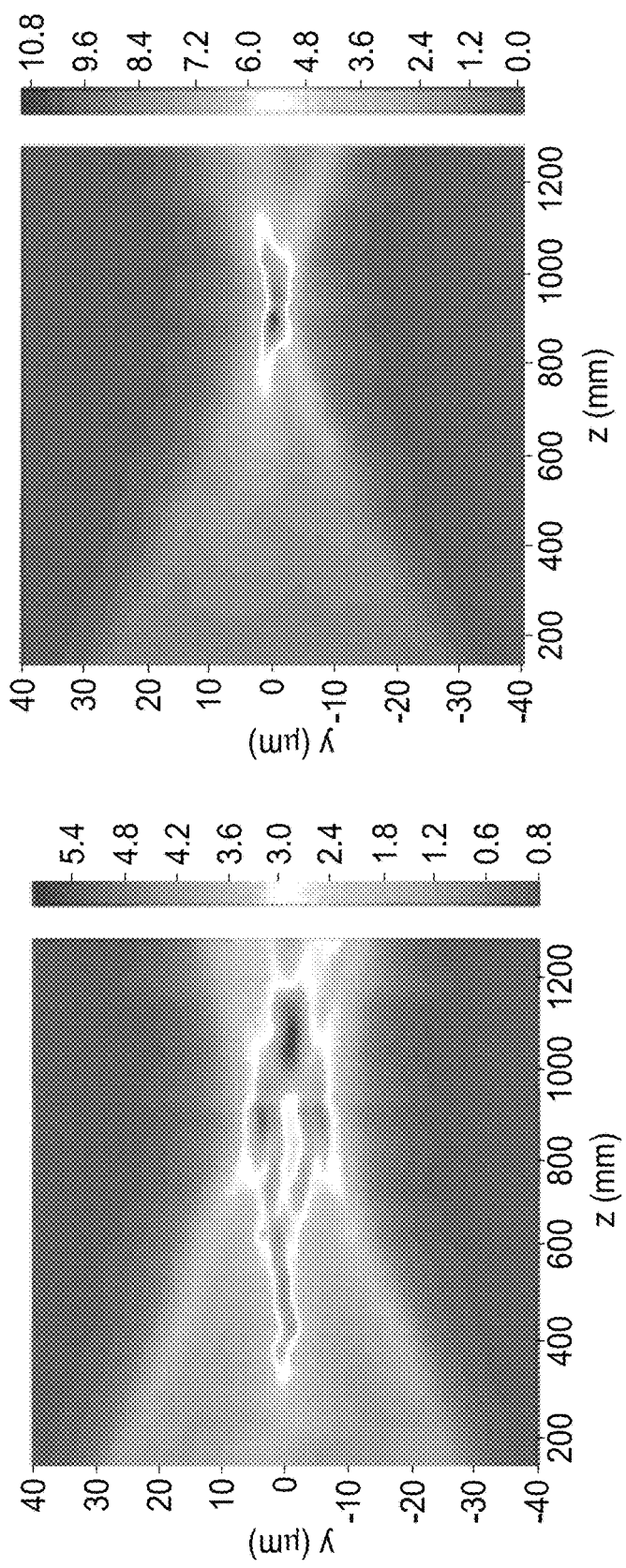
FIG. 8B
FIG. 8D

METHOD OF PRINTING AND IMPLEMENTING REFRACTIVE X-RAY OPTICAL COMPONENTS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for printing refractive x-ray optical components, and specifically to printing polymer optical components having high smoothness surfaces.

BACKGROUND

Refractive X-ray optics are widely used in X-ray beam delivery systems to manipulate the X-ray beam. One prominent use of refractive optics, in the field of X-rays, is to focus an X-ray beam onto a sample for performing investigations or manipulations of the sample. Focusing of X-ray beams is required for many applications including for causing radiation interference, increasing scattering speckle size, and for performing oversampling of a far-field X-ray detector, which is required for coherent diffractive imaging reconstructions.

Current methods of fabricating refractive X-ray optics are top-down techniques, and limitations of these top-down techniques result in components having sub-optimal optical performance. For example, commercially available compound refractive lenses (CRLs) are fabricated by pressing crystal powders of low-atomic-number metallic materials into blocks of concave parabolic shapes. Due to the limitations of the pressing and molding precisions, and the lack of control of the surface roughness, the tail of a beam profile at a focal plane of the CRL is typically pronounced and widely distributed which reduces the flux at the focal plane which is often undesirable. Additionally, the incoherent background scattering of typical CRLs is high due to scattering from crystal boundaries within the optics.

Kinoform lenses are also used for focusing X-rays. Kinoforms are often fabricated by E-beam lithography and deep etching on silicon wafers. Silicon materials increase X-ray absorption of the optical device which reduces the efficiency of the optics. Further, large etching depths reduce the ability to control the shapes at the tooth edges of the Kinoform resulting in imperfect focusing.

Current refractive optics are not robust for operating with different X-ray beam energies, typically perform at a single focal distance, and are unable to provide asymmetric focusing in transverse directions. A transfocator device has been used to provide some flexibility for CRLs by mechanically inserting or removing individual lenses, but transfocators are expensive to acquire, expensive to maintain, and are typically bulky devices that require real estate in a beam-line that may not be available.

SUMMARY OF THE DISCLOSURE

A method of fabricating a refractive optical element including coating a substrate with a resin and providing radiation to a portion of the resin. The radiation is configured to cause two photon polymerization of the resin to cause the formation of a first surface of a polymer refractive optical element from the resin. The first surface is disposed along an optical axis of the refractive optical element and the first surface has a roughness of less than 100 nanometers. The method further includes providing radiation to a portion of the resin to form, by two photon polymerization, a second surface of the polymer refractive optical element. The second surface is disposed along the optical axis of the refractive optical element and the second surface has a roughness of less than 100 nanometers.

BRIEF DESCRIPTION OF THE DRAWINGS

FIG. 8A is a schematic diagram of a top-down view of a CRL lens array with lenses having defects.

FIG. 8B is a plot of the wavefront intensity of an X-ray beam propagating near the focal plane of the CRL lens array of FIG. 8A.

FIG. 8C is schematic diagram of a top-down view of the CRL lens array of FIG. 8A with a phase corrective plate disposed along the optical axis D.

FIG. 8D is a plot of the wavefront intensity of an X-ray beam propagating along the optical axis D near the focal plane of the CRL lens array of FIG. 8C having the phase corrective plate.

DETAILED DESCRIPTION

Figure 1A:
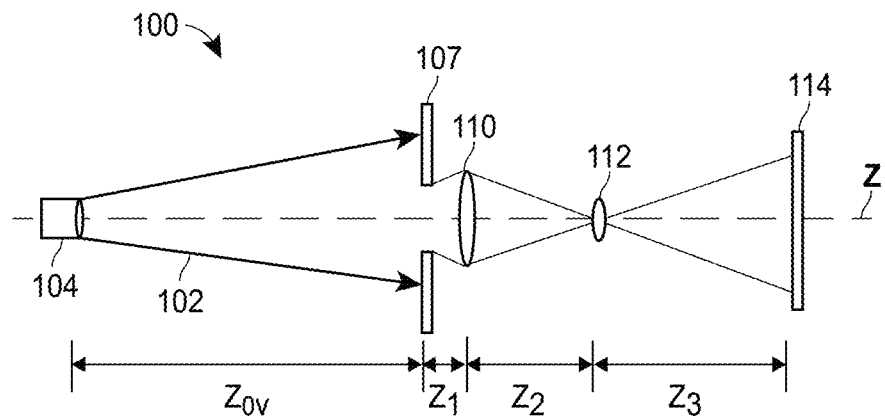
FIG. 1A is a side view schematic diagram of an optical system for focusing an X-ray beam using a multiphoton polymerized optical element.

High resolution multiphoton polymerized optical elements having a high degree of surface smoothness and an associated method of fabrication of the optical elements are disclosed. The method utilizes multiphoton polymerization lithography (MPPL), which allows for higher spatial resolution of fabrication as compared to other techniques. The disclosed method may be useful in manufacturing various types of X-ray optics including compound refractive lenses (CRLs), kinoform lenses, phase correctors, 2-dimension CRLs, transfocators-on-a-chip, and other refractive X-ray optics for manipulating an X-ray wavefront for use in beamlines such as synchrotron X-ray sources and X-ray free electron lasers. The optical elements may be useful as components in laboratory X-ray sources, for rotation anode sources, and liquid-metal-jet X-ray sources to focus or collimate an X-ray beam among other sources and systems. Additionally, the described optical elements may be used to replace current X-ray optics or to phase correct X-ray optics currently in use in optical systems.

The optical elements fabricated by the described method provide multiple benefits over other X-ray optical elements. Also, commercial CRLs contain multiple optical elements, are fairly large, require their own chamber, and take up significant space in a beam delivery system, whereas the disclosed refractive optics may be fabricated on a single chip which requires much less space and fewer positioning stages and devices. Importantly, the disclosed refractive optical elements achieve diffraction limited performance that cannot be attained by commercial CRLs.

A transfocator is an optical element that allows for tuning of a focal plane of the optical element. Transfocators are useful in X-ray beam lines for providing the ability to operate at different radiation energies, and for focusing the radiation across a range of focal distances. Typically, transfocators can be bulky and it may be cumbersome to change the alignment of a transfocator. A transfocator-on-chip is described herein which is more compact that traditional transfocators and allows for easy alignment of the transfocator and tuning of the transfocator focal distance.

The disclosed method uses MPPL to achieve fast fabrication of X-ray refractive optics (at a relatively lower cost). The method provides improved printing resolution and optical element surface roughness as compared to other fabrication techniques. An MPPL printer using resins of low-Z materials, such as acrylates, SU-8, etc. may be used to perform the method described herein. A method of assembling, installation, and alignment of these optics in X-ray beam delivery systems is also described. The assembling method provides an efficient and flexible means for implementing and aligning the optics to meet various needs in X-ray beam delivery systems.

The disclosed methods enable the fabrication of high-quality diffraction-limited refractive optics. The described printing methods allow for the high fidelity transfer of the theoretically designed optical element profiles to the fabricated optics with negligible figure error which reduces aberrations. Typical fabrication processes by which commercial CRLs are made cannot achieve the designed shape and curvature as compared to the disclosed methods. Further, typically optics fabrication methods are unable to achieve roughnesses of less than 20 nm. Additionally, the optics fabricated by the disclosed methods are more homogenous throughout the optical element than other commercial optics because the entire optical element is polymerized, and thus is a single uniform object containing no grains or particles inside. For example, in contrast, commercial Be CRLs are often made by molding Be crystal powders, so there are many crystal grains and hence grain boundaries (i.e., non-homogenous materials) that will degrade the performance of the optic. The preservation of design shape, surface roughness, and homogeneity of the disclosed fabrication methods yield optical elements with wavefront errors well below the Maréchal criterion, making limited diffraction focusing possible.

In electromagnetics, it is common to distinguish a frequency, wavelength, energy, and color of electromagnetic radiation. Each of these four characteristics is related to the other three. For example, the wavelength, in nanometers (nm), and frequency, in hertz (Hz), for a specified electromagnetic radiation are inversely proportional to each other. Similarly, the energy, in electron-volts (eV) or joules (J), of electromagnetic radiation is proportional to the frequency of that radiation. Therefore, for a given radiation at a given frequency, there is a single corresponding wavelength and energy.

The fourth of the aforementioned characteristics, color, typically represents a group or band of frequencies or wavelengths. For example, the color blue is commonly defined as electromagnetic radiation with a wavelength from 450 nm to 495 nm. This wavelength band also corresponds to frequencies from 606 THz to 668 THz, and energies of 2.5 to 2.75 eV. The color blue, then, is any radiation with one of those wavelengths, or radiation with multiple wavelengths in that band. Therefore, the term color may refer to one specific wavelength, or a band of wavelengths. Some areas of trade in electromagnetics prefer the use of one of the four terms over the others (e.g., color and wavelength are preferred when discussing optical filters, whereas frequency and energy are preferred when optical excitation processes). Therefore, the four terms may be understood to be freely interchangeable in the following discussion of electromagnetic radiation and monochromator devices. Although all four terms, color, frequency, wavelength, and energy are related, the terms wavelength, frequency, and energy will be commonly used herein and should be understood to be interchangeable given their respective definitions as is commonly known in the field.

Figure 1B:
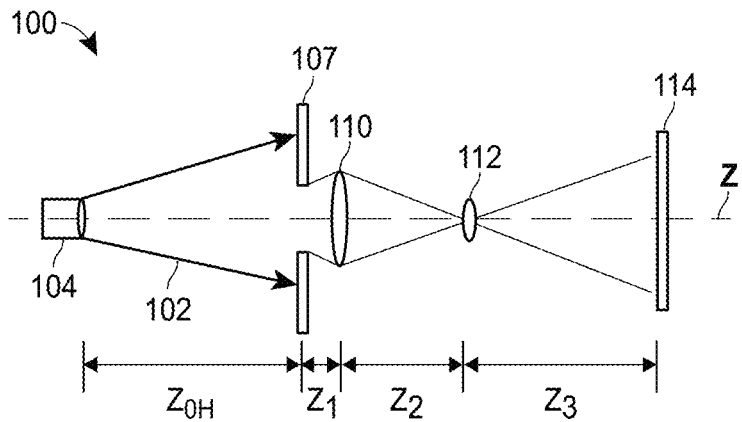
FIG. 1B is a top-down view schematic diagram of an optical system for focusing an X-ray beam using a multiphoton polymerized optical element.

Refractive X-ray optics utilize the contrast of indices of refraction at surfaces between two materials to change the direction of the X-rays. A coherent X-ray beam is often desired for effective focusing of X-ray beams. The degree of coherence of a monochromatic beam is defined by two orthogonal and independent coherent lengths of the beam along the transverse horizontal and vertical directions. The coherence of a beam depends on horizontal and vertical dimensions of the X-ray source and the distance between the source and focusing optics. For a given material, the refractive index of a material depends on the energy of the X-ray and, therefore, varying the energy of the incident X-ray changes the focal distance for a given optical element. FIGS. 1A and 1B are schematic diagrams of an optical system 100 for focusing an X-ray beam 102 using a multiphoton polymerized optical element as described herein. FIG. 1A is a side view showing focusing of the vertical component of the beam 102, while FIG. 1B is a top-down view of showing the focusing of the horizontal component of the beam 102.

The optical system 100 includes a radiation source 104 that provides the X-ray beam 102. The beam 102 propagates along an optical axis Z. An aperture 107 is disposed along the optical axis and the aperture is configured to collimate the beam 102. The aperture 107 is positioned at a near-field distance $Z_1$ upstream of a printed focusing lens 110. The printed focusing lens 110 is an optical element that is fabricated using the multiphoton polymerization printing method described herein. The printed focusing lens 110 is configured to focus the beam 102 at a focal plane 112, a distance of $Z_2$ from the focusing lens 110. A sample may be placed at the focal plane 112 such that the beam 102 is focused onto the sample for performing an interrogation of the sample (e.g., spectrometry, speckle analysis, etc.), or for another reason. The optical system 100 further includes a detector 114 disposed at a distance $Z_3$ from the focal plane 112. The detector 114 is disposed along the optical axis Z configured to detect the beam 102. The detector 114 may be a scintillator coupled CCD detector configured to measure the size and quality of the focused beam 102. The detector 114 may be configured to perform one-dimensional integrated fluorescence knife-edge scans at and/or near the focal plane 112 to determine characteristics of the focused beam 102. The detector 114 may be a far-field detector configured to perform coherent ptychography imaging to determine the intensity and phase profiles of the focused beam 102. The detector 114 may be configured to detect different coherent diffractive speckles produced from a sample placed at the focal plane 112 and a processor may be configured to reconstruct the speckle of the sample for performing ptychography.

The optical system 100 of FIGS. 1A and 1B is an example of an optical system for performing the characterization of optical elements printed according to the disclosed methods. For example, the optical system 100 may be used to measure the performance of a two-dimensional focusing element fabricated according to the disclosed method. As illustrated in FIGS. 1A and 1B, the radiation source 104 may have different vertical and horizontal dimensions, resulting in the beam 102 having different divergences in the horizontal and vertical directions. Therefore, as shown in FIGS. 1A and 1B, to focus the beam 102 at the focal plane 112, the source 104 would need to provide the vertical component of the beam 102 at a distance $Z_{0V}$ from the aperture 107, while the source 104 simultaneously provided the horizontal component of the beam 102 at a different distance $Z_{0H}$ away from the aperture 107, which is impractical. Therefore, to focus the both components of the beam 102 at the focal plane 112, the printed focusing lens 110 may be a two-dimensional printed focusing lens that is capable of providing one focus to the vertical component of the beam 102, while providing a different focus to the horizontal component of the beam resulting in the beam being focused at the desired focal plane 112. A two-dimensional focusing optical element was fabricated according to the described method and the optical element characterized using the system 100 of FIGS. 1A and 1B, discussed further herein in reference to FIGS. 5A-6D. A two-dimensional focusing lens according to the described fabrication method more compact than traditional two-dimensional focusing elements.

Figure 1C:
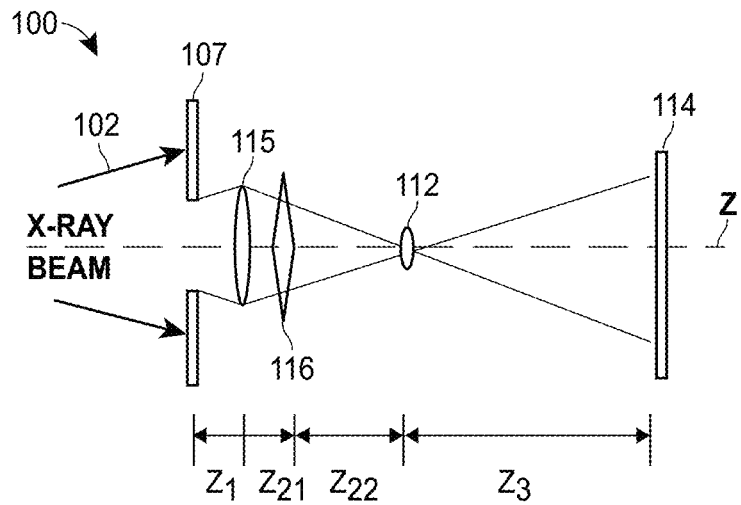
FIG. 1C is a schematic diagram of an embodiment of an optical system having a printed phase corrector.

FIG. 1C is an embodiment of the optical system 100 having a printed phase corrector 116 for correcting phase distortions of the beam 102. The printed phase corrector 116 is an optical element that is fabricated using the multiphoton polymerization printing method described herein. Phase distortions may occur in optical systems due to radiation sources, apertures, defects of optics, roughness of surfaces, incongruities of a medium or optical material, or due to other effects and reasons. The printed phase corrector 116 is a refractive X-ray optical element that delays or advances the phases of X-rays via surface height differences of the printed phase corrector 116. The printed phase corrector 116 is disposed along the optical axis Z at a near-filed distance $Z_{21}$ away from an imperfect lens 115. In one example, the imperfect lens 115 may have surface imperfections that cause phase distortion of the beam 102 as the beam 102 propagates through the imperfect lens 115. A phase distortion map of the wavefront from the imperfect lens 115 may be determined by performing single grating Talbot imaging or ptychography imaging. The shape of the phase corrector 116 may be determined by a material height map that is determined from the phase distortion map. The phase corrector 116 may then be fabricated by MPPL by a printer with high spatial resolution.

Figure 2:
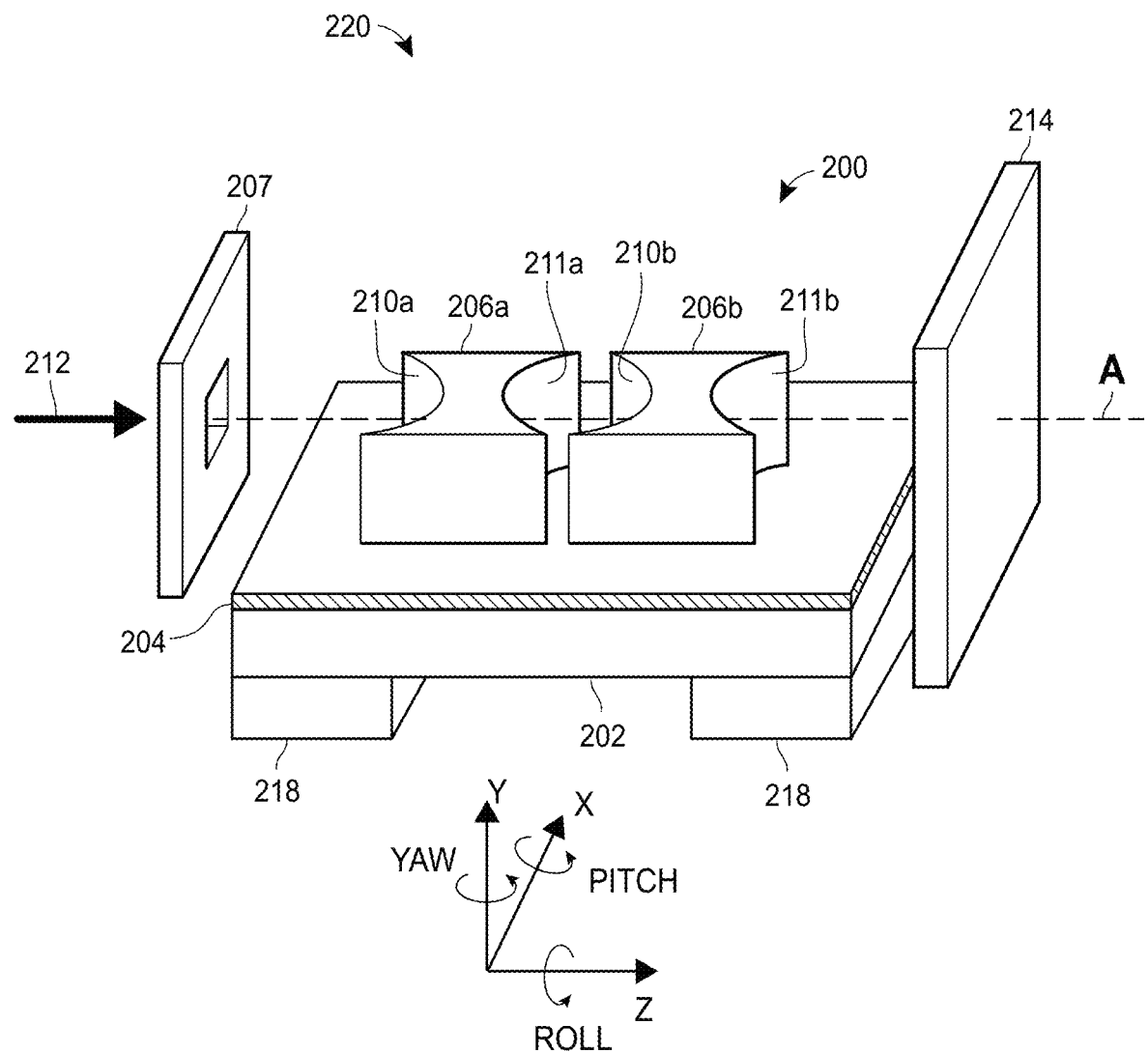
FIG. 2 is a schematic diagram of a perspective view an embodiment of a printed refractive optical element implemented in an X-ray system.

FIG. 2 is a side view of an embodiment of a refractive optical element 200 implemented in an X-ray system 220. The refractive optical element 200 includes first and second polymer optical elements 206a and 206b are fabricated by the MPPL method described herein. The first and second optical elements 206a and 206b may be formed by polymerization of a resin according to multiphoton polymerization due to radiation. The refractive optical element 200 includes a substrate 202 and a layer 204 disposed on a surface of the substrate 202. In embodiments, the substrate may be glass, an organically modified ceramics, a standard photoresist, or any flat and transparent substrate. Further, the layer 204 may include nanoparticles including one or more of indium tin oxide, boron nitride, silicon carbide, boron carbide, aluminum nitride, or another nanoparticle material. In a specific example, the substrate 202 is a flat microscope coverslip and the layer 204 is a thin layer of indium tin oxide (ITO). Using a solid flat substrate as the substrate 202 may be preferred to improve the rigidity and adhesion of the first and second optical elements 206a and 206b to the substrate 202. Flat solid substrates also allow for streamlining of the alignment of the refractive optical element 200 in an optical system which may reduce setup time of the system, or down time if an optical element must be removed or replaced.

The first polymer optical element 206a has first and second surfaces 210a and 211a that are disposed along an optical axis A, and the second polymer optical element 206b has first and second surfaces 210b and 211b that are disposed along the optical axis A. In embodiments, the first and second polymer optical elements 206a and 206b may independently have heights, along the Y axis, of between 1 and 20 microns, between 10 and 50 microns, between 50 and 200 microns, between 100 and 500 microns, between 500 microns and a millimeter, between 1 micrometer and 1 millimeter, less than a millimeter, less than 500 micrometers, less than 100 micrometers, or less than 50 micrometers. Further, the first and second polymer optical elements 206a and 206b may independently have thicknesses, along the Z axis, of between 1 and 20 microns, between 10 and 50 microns, between 50 and 200 microns, between 100 and 500 microns, between 500 microns and a millimeter, between 1 micrometer and 1 millimeter, less than a millimeter, less than 500 micrometers, less than 100 micrometers, or less than 50 micrometers. In embodiments, the a polymer optical element may span the entire length of the substrate along the Z-axis. Further still, the first and second polymer optical elements 206a and 206b may independently have widths, along the X axis, of between 1 and 20 microns, between 10 and 50 microns, between 50 and 200 microns, between 100 and 500 microns, between 500 microns and a millimeter, between 1 micrometer and 1 millimeter, less than a millimeter, less than 500 micrometers, less than 100 micrometers, or less than 50 micrometers.

The layer 204 coats the substrate 202 providing optical contrast for the alignment and leveling of the substrate 202 during the printing of the first and second polymer optical elements 206a and 206b. The layer 204 may also be a thermally conductive material that allows for dissipation of heat generated from radiation provided to the layer 204 during printing or during use of the first and second polymer optical elements 206a and 206b. The layer 204 may coat the entire surface of the substrate 202, or the layer 204 may coat a subsection of the surface of the substrate 202. In embodiments, the layer 204 may have a thickness of 1 micron or greater.

The first and second polymer optical elements 206a and 206b of FIG. 2 are example illustrations of parabolic lenses as part of a CRL as the refractive optical element 200 for focusing an X-ray beam 212. The X-ray system 220 of FIG. 2 may further include an aperture 207 and a detector 214. The X-ray beam 212 may be provided by a radiation source along the optical axis A such that the X-ray beam passes through the aperture 207. The first and second polymer optical elements 206a and 206b together form the CRL that focuses the X-ray beam 212 at desired focal distance.

In embodiments, the substrate 202 may be mounted on a one or more stages 218 with the stages 218 configured to move and position the refractive optical element 200. The stages 218 may include linear stages, rotational stages, actuators, piezoelectric devices, manual stages, motorized stages, or another stage for positioning the refractive optical element 200. To align the refractive optical element 200 to focus the X-ray beam 212, the planar dimension of the substrate 202 is positioned parallel to the propagation of the X-ray beam 212 along the optical axis A. A high-resolution area detector (e.g., with a spatial resolution on the order of 1 um) is implemented as the detector 214 and is disposed along the optical axis A at a near field distance downstream of the optics. The aperture 207 is open wide enough to allow the X-ray beam 212 to overfill the first and second polymer optical elements 206a and 206b. Overfill occurs when the beam diameter or beam size of the X-ray beam 212 is larger than the numerical aperture of the first polymer optical element 206a.

The detector 214 detects the X-ray beam 212 and phase-contrast imaging is performed from lenses 206a and 206b for alignment purposes. The stages 218 translate (e.g., in the X, Y, and Z dimensions) and rotate (e.g., perform pitch, yaw, and roll rotations) the refractive optical element 200 to achieve symmetric alignment of the optics as determined by the phase-contrast imaging. The position and rotation angles of the substrate 202 act as a reference to guide the alignment and positioning of the first and second polymer optical elements 206a and 206b. After the refractive optical element 200 is optically aligned parallel to the X-ray beam 212, the aperture 207 is adjusted to reduce the size of the opening of the aperture. Typically, the aperture 207 may be adjusted to match the transverse coherence lengths of the X-ray beam 212 at the refractive optical element 200. The transverse center locations (e.g., along the X and Y axes) of the opening of the aperture 207 can be synchronously translated together with the transverse position of the refracted optical element 200 across the full X-ray beam 212 to selectively focus regions of interest of the X-ray beam.

While the refractive optical element 200 or FIG. 2 is illustrated as a two lens CRL, the refractive optical element 200 may be a phase corrective plate, a refractive lens, a one-dimensional focusing lens, a two-dimensional focusing lens, a transfocator, or another optical element that is refractive.

Figure 3A:
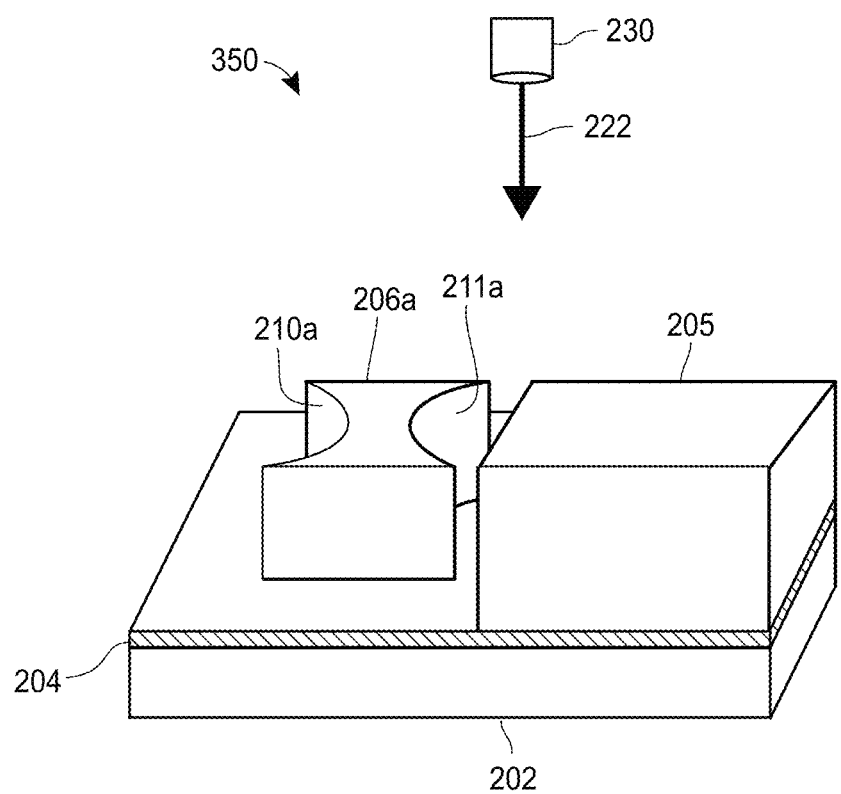
FIG. 3A is a schematic diagram of an embodiment of an multiphoton polymerization lithography (MPPL) printing system for fabricating a refractive optical element.
Figure 3B:
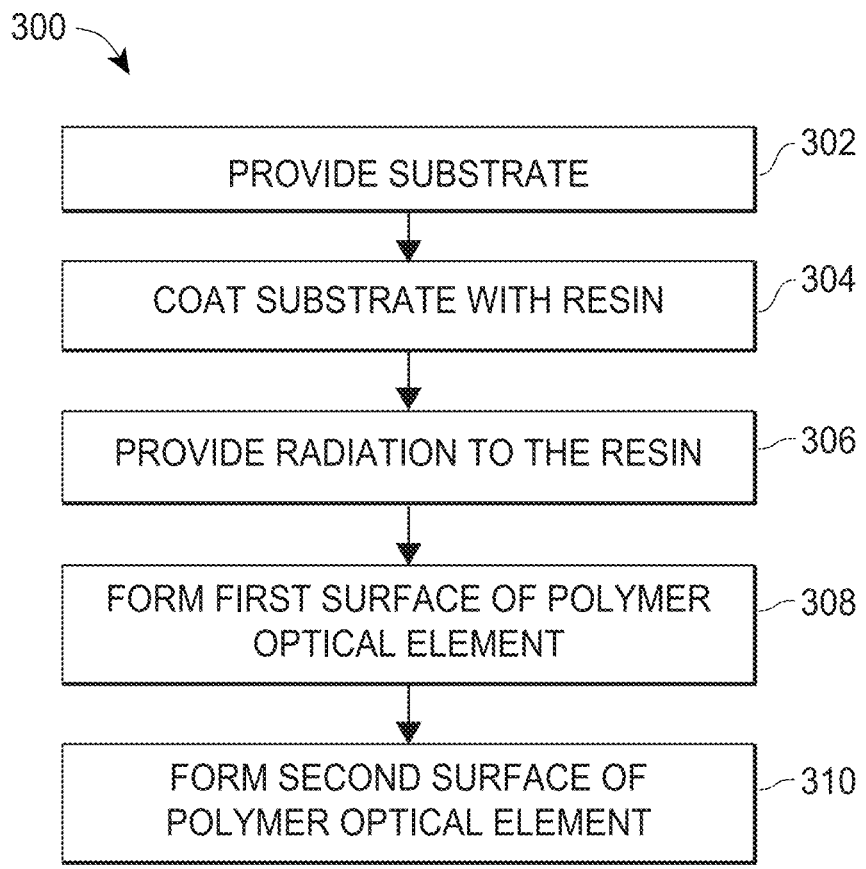
FIG. 3B is a flow chart of a method for performing MPPL for fabricating a refractive optical element.

FIG. 3A is an embodiment of an MPPL printing system 350 for fabricating a refractive optical element, such as the refractive optical element 200 of FIG. 2. FIG. 3B is a flow chart of a method 300 for fabricating a refractive optical element. The method 300 of FIG. 3B may be performed by the system 350 of FIG. 3A. Referring simultaneously to FIGS. 3A and 3B, the method 300 includes providing the substrate 202 (block 302). The substrate 202 may be a hard flat substrate that provides a flat surface for providing support for the first polymer optical element 206a. The substrate 202 may include the layer 204 which may include one or more of indium tin oxide, boron nitride, silicon carbide, boron carbide, and aluminum nitride. The method further includes providing the substrate 202 with a resin 205 (block 304). The resin 205 may be provided by a placing a droplet of the resin 205 onto the substrate 202. Further, multiple drops of the resin 205 may be provided to form a region of the substrate 202 that is covered by the resin 205.

A polymerization radiation source 230 provides radiation 222 to a portion of the resin 205 (block 306) to form the first surface 210a of the first polymer optical element 206a that is disposed along the optical axis A closest to the aperture 207 (block 308). In embodiments, motors or stages may be physically coupled to the polymerization radiation source 230 to move the polymerization radiation source 230 to provide the radiation 222 to different regions of the resin 205. Further, motors or stages may be physically coupled to the substrate 202 to move the substrate 202 to allow for the radiation 222 to be provided to different regions of the resin 205. The radiation 222 has an energy and intensity configured to cause two-photon polymerization of the resin 205 to form the first surface 210a of the first polymer optical element 206. The first surface 210a of the first polymer optical element 206a may be a concave surface, convex surface, flat surface, spherical surface, aspheric surface, or another surface for manipulating the wavefront of the X-ray beam 212. In embodiments, the first surface 210a of the first polymer element 206a may have a surface roughness of less than 1 micrometer, less than 100 nanometers, less than 50 nanometers, or less than 20 nanometers. The radiation 222 is then provided to the resin 205 to cause two-photon polymerization to form a second surface 211a of the first polymer optical element 206a (block 308). The second surface 211a of the first polymer optical element 206a may be a concave surface, convex surface, flat surface, spherical surface, aspheric surface, or another surface for manipulating the wavefront of the X-ray beam 212. In embodiments, the second surface 211a of the first polymer element 206a may have a surface roughness of less than 1 micrometer, less than 100 nanometers, less than 50 nanometers, or less than 20 nanometers. The first and second surfaces 210a and 211a of the first polymer optical element 206a are disposed along the optical axis A. The radiation 222 has an energy configured to cause two-photon absorption of the resin 205 for performing MPPL to fabricate the first polymer optical element 206a. The resin 205 may be an acrylic, a hydrogel, a siloxane, an organic/inorganic hybrid material, an epoxy, a negative-tone photoresist or another photoresist. In embodiments, the resin 205 may be any material that can undergo polymerization due to multiphoton absorption.

In embodiments, the first and second surfaces 210a and 211a of the first optical element 206a may be coated with a material to provide thermal dissipation and/or structural reinforcement. The coating may include carbon, boron, nitrogen, aluminum or another low-Z material. The coating may be applied by performing atomic layer deposition, or by another deposition method. In any of the embodiments described herein, any surface of an optical element may have an applied coating.

In embodiments, the polymerization radiation source 230 may be a continuous laser source, a pulsed laser source, a femtosecond laser, another laser, or another radiation source capable of providing radiation for performing MPPL of the resin 205.

Figure 3C:
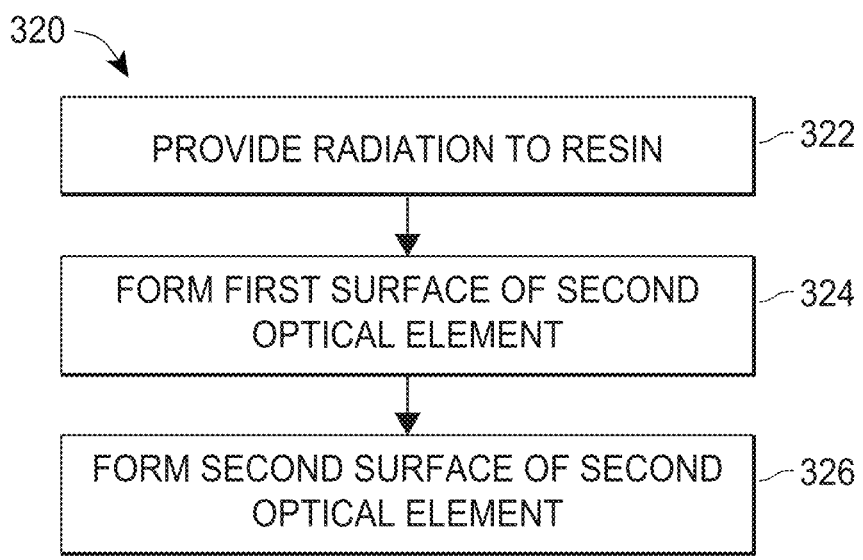
FIG. 3C is a flow diagram of a method for fabricating a second polymer optical element.

The method 300 may further include performing MPPL to fabricate a second polymer optical element from the resin 205, such as the second polymer optical element 206b illustrated in FIG. 2. FIG. 3C is a flow diagram of a method 320, which may be performed in addition to the method 330 of FIG. 3B, for fabricating a second polymer optical element, such as the second polymer optical element 206b of the refractive optical element 200 of FIG. 2. The method 320 includes providing the radiation 222 to the resin 205 (block 322) to form the first surface 210b of the second polymer optical element 206b (block 324). The first surface 210b of the second polymer optical element 206b may be a concave surface, convex surface, flat surface, spherical surface, aspheric surface, or another surface for manipulating the wavefront of the X-ray beam 212. The first surface 210b of the second polymer optical element 206b may have a surface roughness of less than 1 micrometer, less than 100 nanometers, less than 50 nanometers, or less than 20 nanometers. The polymer radiation source 220 then provides the radiation 222 to the resin 205 to fabricate the second surface 211b of the second polymer optical element 206 (block 326). The second surface 211b of the second polymer optical element 206b may have a surface roughness of less than 1 micrometer, less than 100 nanometers, less than 50 nanometers, or less than 20 nanometers. The first and second surfaces 210b and 211b are disposed along the optical axis A.

The first and second polymer optical elements 206a and 206b may be configured to work in tandem to function as the refractive optical element 200. For example, as illustrated in FIG. 2, the first and second polymer optical elements 206a and 206b may together function as a compound refractive lens for focusing an X-ray beam. Further, the fabrication methods 300 and 320 of FIGS. 3A and 3B may be performed as many times as required to form a plurality of polymer optical elements for manipulating an X-ray beam. In embodiments, the first and second polymer optical elements 206a and 206b may be disposed on different optical axes and therefore, the first and second polymer optical elements 206a and 206b may independently manipulate an X-ray beam, discussed further herein in reference to dimensional focusing of an X-ray beam in FIG. 4C, and the transfocator of FIG. 9.

Figure 4A:
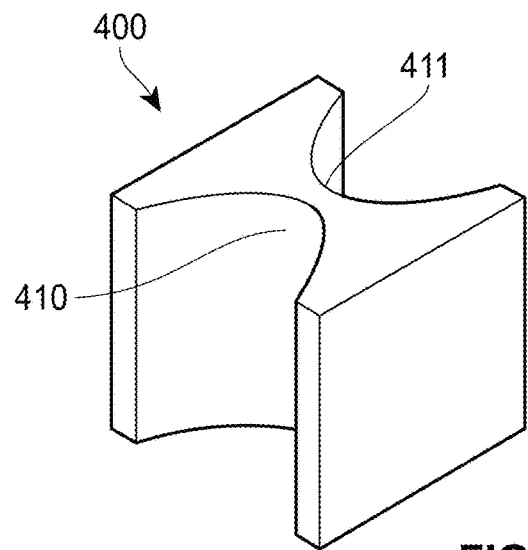
FIG. 4A is a schematic diagram of a one-dimensional focusing lens.
Figure 4B:
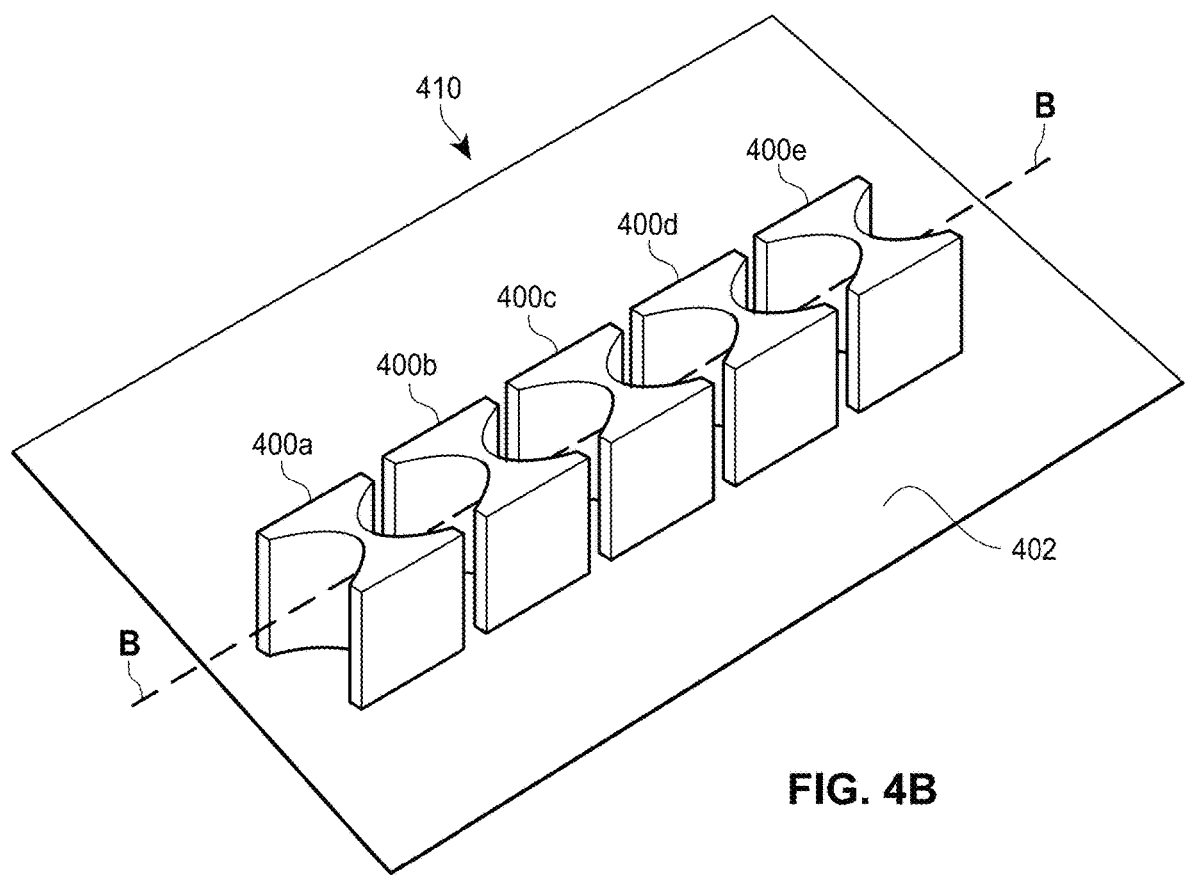
FIG. 4B illustrates an embodiment of a one-dimensional compound refractive lens (CRL) formed by a plurality of one-dimensional lenses.

In an embodiment, the MPPL-printed refractive optical element may by a one-dimensional (1D) focusing compound refractive lens (CRL). The 1D CRL is fabricated by performing the method 300 of FIG. 3B a plurality of times to print a plurality of 1D lenses. FIG. 4A is a schematic diagram of a 1D lens 400 having a first surface 410 and a second surface 411. The first and second surfaces 410 and 411 may independently be a parabolic surface, concave surface, convex surface, flat surface, spherical surface, aspheric surface, or another surface for focusing the wavefront of an X-ray beam. FIG. 4B illustrates an embodiment of a 1D CRL 410 formed by a plurality of the 1D lens of FIG. 4A. The plurality of 1D lenses 400a-400e are fabricated from a resin as described herein. Further, the plurality of 1D lenses 400a-400e is disposed on a substrate 402 and physically supported by the substrate 402. Each of the plurality of 1D lenses 400a-400e has a first surface and second surface 410 and 411, respectively (see FIG. 4A), with each first surface 410 and second surface 411 disposed along the optical axis B. An X-ray beam may be provided to the first surface 410 of a first lens 400a of the plurality of 1D lenses 400a-400e to focus the X-ray beam. As illustrated in FIG. 4B, the 1D CRL 410 is configured to focus an X-ray beam in the horizontal dimension parallel to the plane of the substrate and perpendicular to the optical axis B.

Figure 4C:
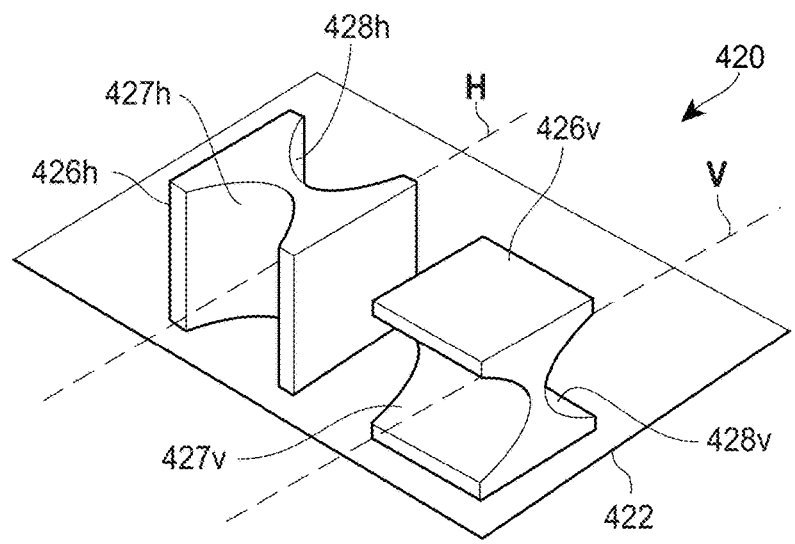
FIG. 4C illustrates an embodiment of lens chip having two one-dimensional lenses disposed on a substrate for focusing of an X-ray beam.

FIG. 4C illustrates an embodiment of lens chip 420 having two 1D lenses 426h and 426v disposed on a substrate 422 for focusing an X-ray beam. The two 1D lenses 426h and 426v include a 1D horizontal focusing lens 426h, and a 1D vertical focusing lens 426v. The 1D horizontal focusing lens 426h has a first and second surface 427h and 428h disposed along an optical axis H with the 1D horizontal focusing lens configured to focus an X-ray beam in the horizontal dimension. The 1D vertical focusing lens 426v has a first surface 427v and a second surface 428v, each disposed along an optical axis V with the 1D vertical focusing lens 426v configured to focus an X-ray beam in the vertical dimension, i.e., the direction normal to the plane of the substrate 422. In the embodiment of the lens chip 420 of FIG. 4C, the optical axis H and the optical axis V are not a same optical axis. Therefore, the 1D horizontal focusing lens 426h focuses a beam propagating along the optical axis H, while the 1D vertical focusing lens 426v focuses an X-ray beam propagating along the optical axis V. In an embodiment, mounts may be physically coupled to the substrate 422, such as the mounts 218 of FIG. 2. The mounts may be configured to adjust the position and orientation of the lens chip 420. Therefore, the fabrication methods described herein allow for fabrication of the two 1D lenses 426h and 426v on the same chip 420 enabling fast and efficient selection of focusing of an X-ray beam in the horizontal or vertical dimensions through translation of the lens chip 420.

Figure 4D:
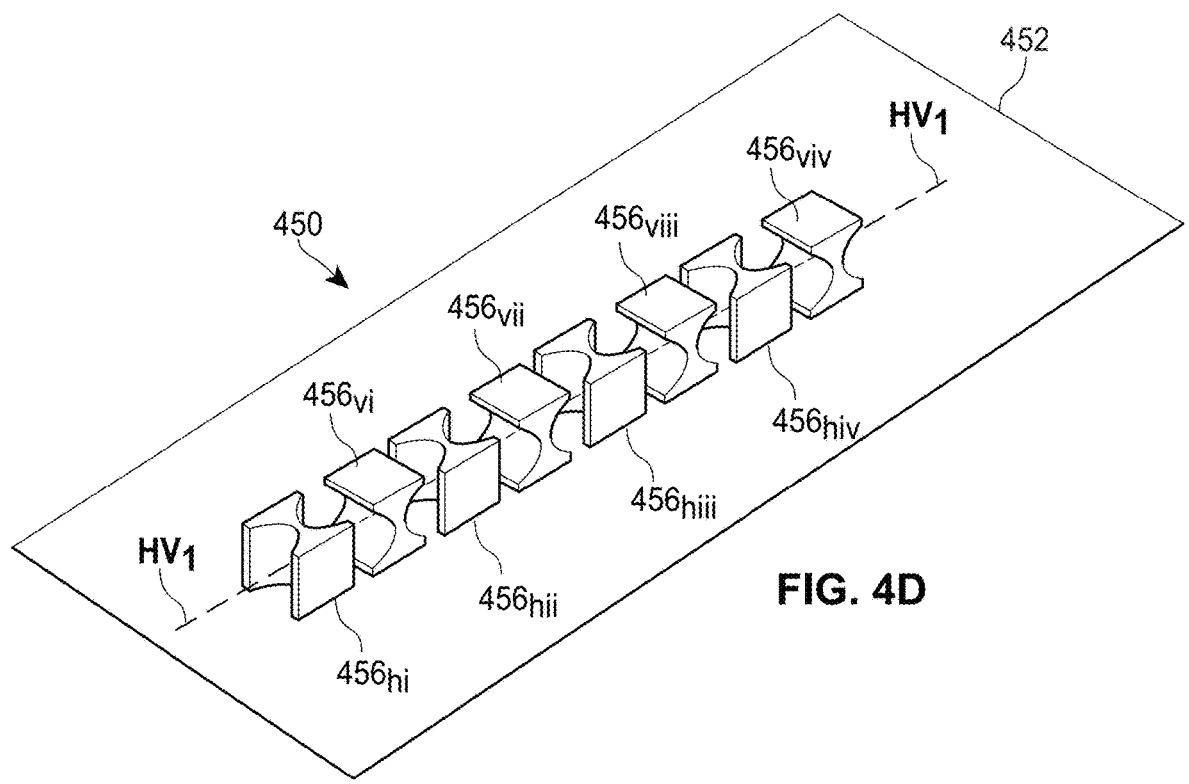
FIG. 4D illustrates an embodiment of a two-dimensional focusing CRL having a plurality of horizontal and vertical focusing lenses.

FIG. 4D illustrates an embodiment of a two-dimensional (2D) focusing CRL 450. The 2D focusing CRL 450 of FIG. 4D includes a plurality of 1D horizontal focusing lenses $456h_i$-$456h_{iv}$, and a plurality of 1D vertical focusing lenses $456v_i$-$456v_{iv}$ disposed on a substrate 452. Each of the lenses of the 1D horizontal focusing lenses $456h_i$-$456h_{iv}$ and vertical focusing lenses and $456v_i$-$456v_{iv}$ has a first and second surface (i.e., as illustrated in FIG. 4C for the 1D horizontal and vertical focusing lenses 426h and 426v) with each of the surfaces disposed along an optical axis $HV_1$. The plurality of the 1D horizontal focusing lenses $456h_i$-$456h_{iv}$ and vertical focusing lenses $456h_i$-$456h_{iv}$ are configured to form the 2D focusing CRL 450 to focus an X-ray beam in both the horizontal and vertical directions as the X-ray beam propagates through the plurality of 1D lenses. In the embodiment of the 2D focusing CRL 450 of FIG. 4D, the 1D horizontal focusing lenses $456h_i$-$456h_{iv}$ are interlaced with the 1D vertical focusing lenses $456v_i$-$456v_{iv}$ to focus a beam in two dimensions. In other embodiments, a 2D focusing CRL may include a first plurality of 1D horizontal focusing lenses disposed adjacent to each other along the propagation axis $HV_1$ followed by a plurality of 1D vertical focusing lenses disposed adjacent to each other along the propagation axis $HV_1$. In embodiments, any arrangement of 1D lenses may be disposed on the substrate along a same optical axis to focus an X-ray beam in two dimensions. As a person of ordinary skill in the art would understand, the lens surface shapes, lens dimensions, lens interlacing, and the number of lenses of the 2D focusing CRL 450 are determined to fabricate a 2D focusing CRL having a desired focal plane distance in both the horizontal and vertical dimensions. Typically, as previously discussed, it is desirable to have a same focal plane in both the horizontal and vertical directions, but, in some applications it may be desirable to have a horizontal focal plane having a different focal plane distance than a vertical focal plane for a single 2D focusing CRL.

Figure 5A:
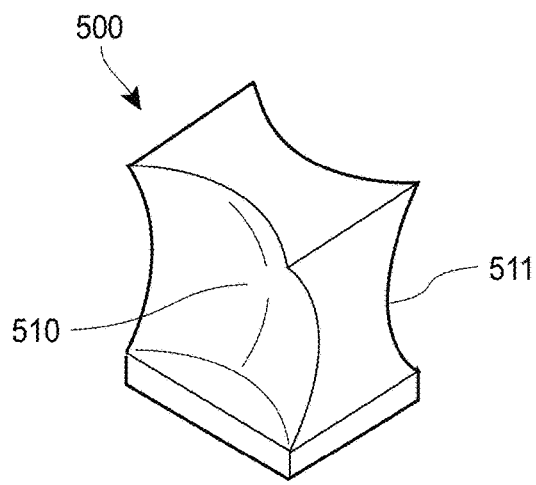
FIG. 5A illustrates an embodiment of a two-dimensional focusing lens.

FIG. 5A illustrates an embodiment of a 2D lens 500 having a first surface 510 and a second surface 511. The first and second surfaces 510 and 511 of the 2D lens 500 are elliptic paraboloid surfaces configured to focus an X-ray beam in both the horizontal and vertical directions. The first and second surfaces 510 and 511 of the 2D Lens 500 may be printed with asymmetric paraboloid surfaces in order to focus an X-ray beam at different focal plane distances for the horizontal and vertical directions. Typical commercial lens molding methods for fabricating CRLs require that a parabolic surface of a CRL lens be rotationally symmetric, and therefore, other fabrication methods are incapable of fabricating the 2D lens 500 of FIG. 5A.

Figure 5B:
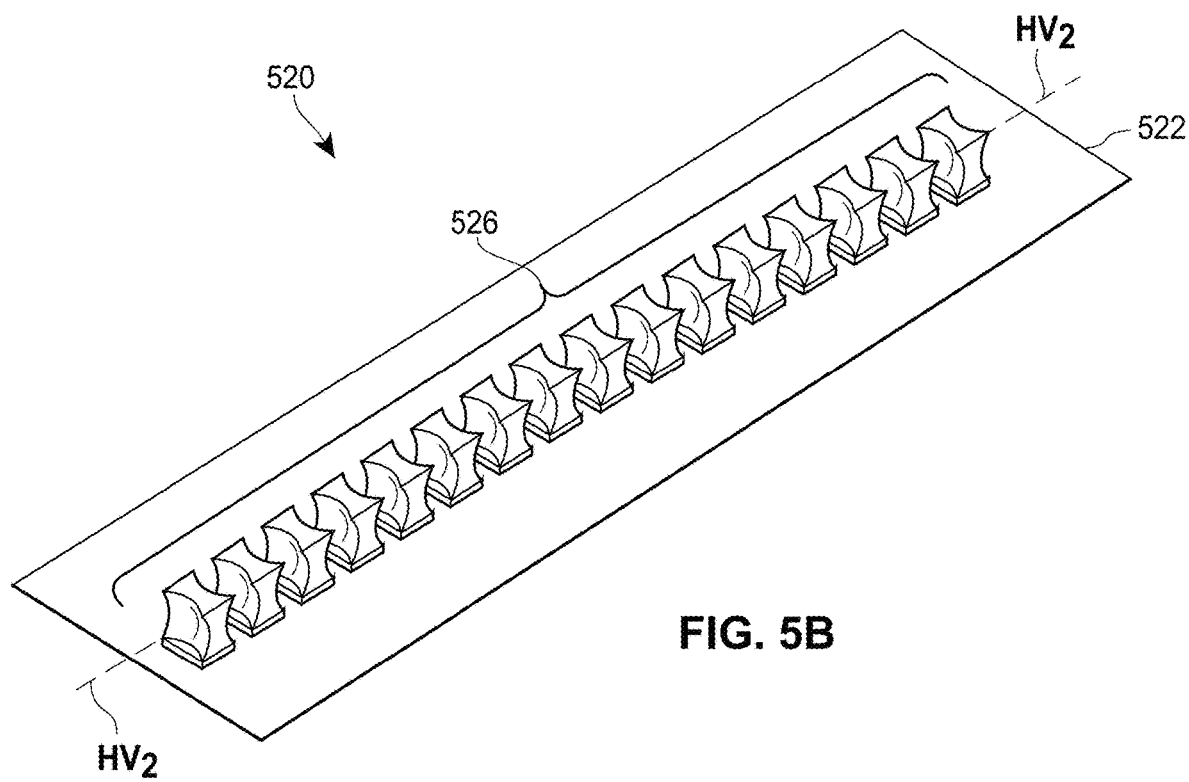
FIG. 5B illustrates an embodiment of a two-dimensional focusing CRL having a plurality of 2D lenses.

FIG. 5B illustrates an embodiment of a 2D focusing CRL 520 having a plurality of 2D lenses 526 disposed on a substrate 522. Each lens of the plurality of 2D lenses 526 has a first and second surface (e.g., the first and second surfaces 510 and 511 of the 2D lens 500 of FIG. 5A) disposed along the optical axis $HV_2$. The plurality of lenses 526 is configured to focus an X-ray beam in both the horizontal and vertical directions as the X-ray beam propagates along the optical axis $HV_2$. In embodiments, all of the lenses of the plurality of lenses 526 may have identical first surfaces, identical second surfaces, or identical first and second surfaces. In other embodiments, each lens of the plurality of lenses 526 may have different surface shapes. In yet other embodiments, lenses of the plurality of lenses 526 may include both identical surfaces between lenses and unique surfaces for manipulating a wavefront of an X-ray beam propagating through the plurality of lenses 526.

The FIGS. 4D and 5B are illustrative of two different embodiments of 2D focusing CRLS 450 and 520. The 2D focusing CRL 450 of FIG. 4D employs independent interlaced horizontal and vertical 1D focusing lenses, while the 2D focusing CRL 520 of FIG. 5B employs a plurality of 2D lenses 526. Each of the 2D focusing CRLS 450 and 520 may be fabricated by the disclosed system and methods illustrating the versatility of the fabrication method for fabrication X-ray optics on a single substrate.

Figure 6A:
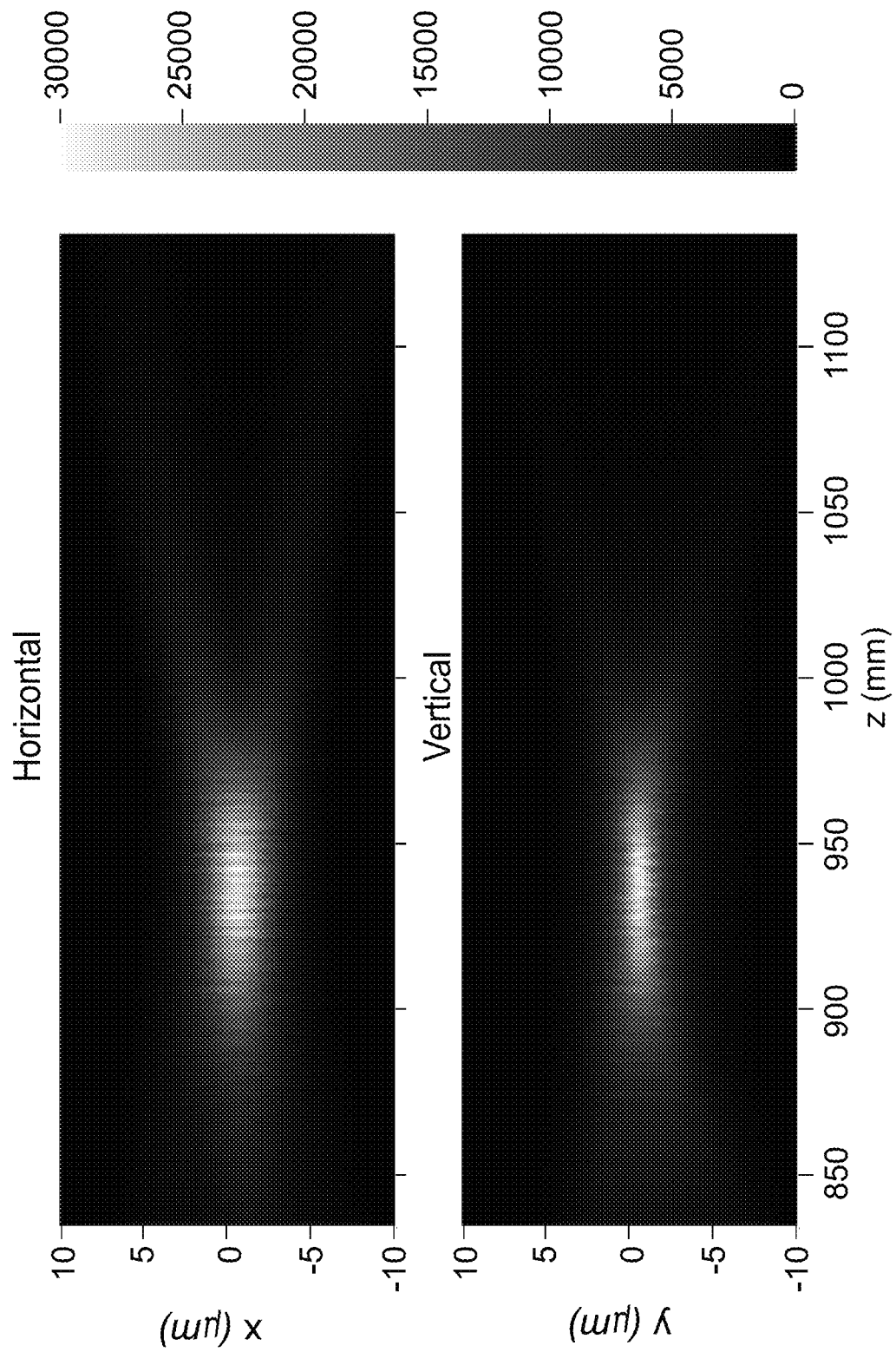
FIG. 6A presents two plots of X-ray beam intensity in the X and Y directions at different positions along an axis of propagation.

A 2D focusing CRL 520 of FIG. 5B was fabricated according to the described methods. The first surface 510 of each 2D lens of the plurality of 2D lenses 526 was designed to be identical, and each second surface 511 of each 2D lens of the plurality of lenses 526 was designed to be identical. The first and second surfaces 510 and 511 of each lens of the 2D lenses 526 was an asymmetric paraboloid surface to an X-ray beam at the same focal plane in both the horizontal and vertical directions. The 2D focusing CRL 520 was optically aligned and a monochromatic X-ray beam of 10 keV was provided to the 2D focusing CRL 520. A high-resolution X-ray detector was used at near field to align the 2D CRL 520 and then the X-ray detector was relocated to approximately the desired focal distance to determine the focal plane of the 2D CRL 520. The focal plane was at approximately 944 mm from the 2D CRL 520. The detector was translated along the axis of propagation (i.e., the Z-axis) scanning the beam to generate a 3D intensity profile. FIG. 6A includes two plots of beam intensity in the X and Y directions at different positions along the axis of propagation. FIG. 6A shows that the beam waist (i.e., the focal point) is at approximately the same location in both the X and Y transverse directions.

Figure 6B:
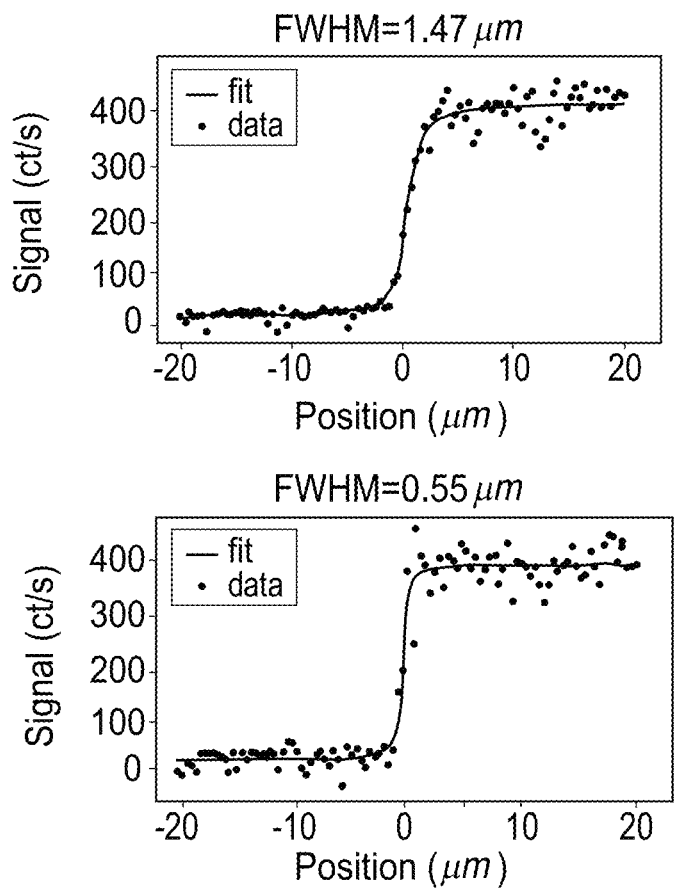
FIG. 6B presents two plots of photon counts vs. transverse direction obtained by performing fluorescence knife edge scans on an energy-resolving X-ray detector for determining the FWHM spatial bandwidth of a focused X-ray beam.
Figure 6C:
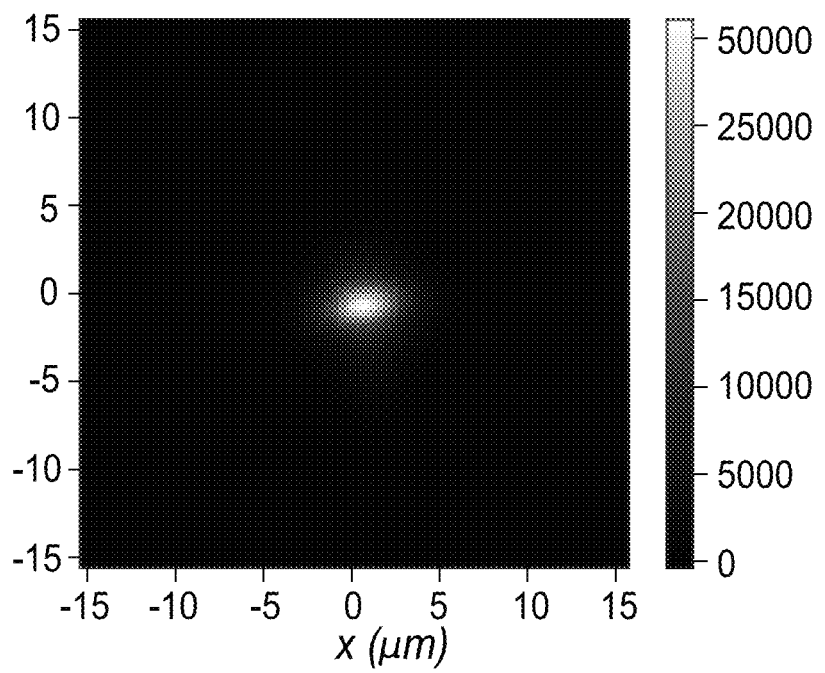
FIG. 6C is a plot of intensity of a focused X-ray beam in the horizontal and vertical planes at the focal plane.

FIG. 6B shows two plots of the photon counts vs. transverse direction obtained by performing fluorescence knife edge scans on an energy-resolving X-ray detector for determining the FWHM spatial bandwidth of the focused X-ray beam. The top plot shows data from a horizontal scan while the bottom plot is data from a vertical scan. The data fitting line of plots of FIG. 6B show that the horizontal and vertical FWHM's of the X-ray beam were approximately 1.47 microns and 0.55 microns, respectively. FIG. 6C is a plot of the intensity of the focused X-ray beam in the horizontal and vertical planes at the focal plane. The plot of FIG. 6C shows that the beam is slightly elliptical having a semi-minor axis in roughly the vertical direction.

Commercial CRL units often require additional frames and/or mounts for supporting individual lenses of the CRL unit, and affixing the relative positions of the lenses. As illustrated in FIGS. 4B, 4D, and 5B, CRL fabricated according to the method described herein, only require support from the substrate that the lenses are printed on. Therefore, the methods disclosed can be used to fabricate CRLs without requiring extra borders or supporting frames which increases the entrance area of an X-ray beam propagating into the CRL, and reduces the time required for printing of the CRLs.

Figure 7A:
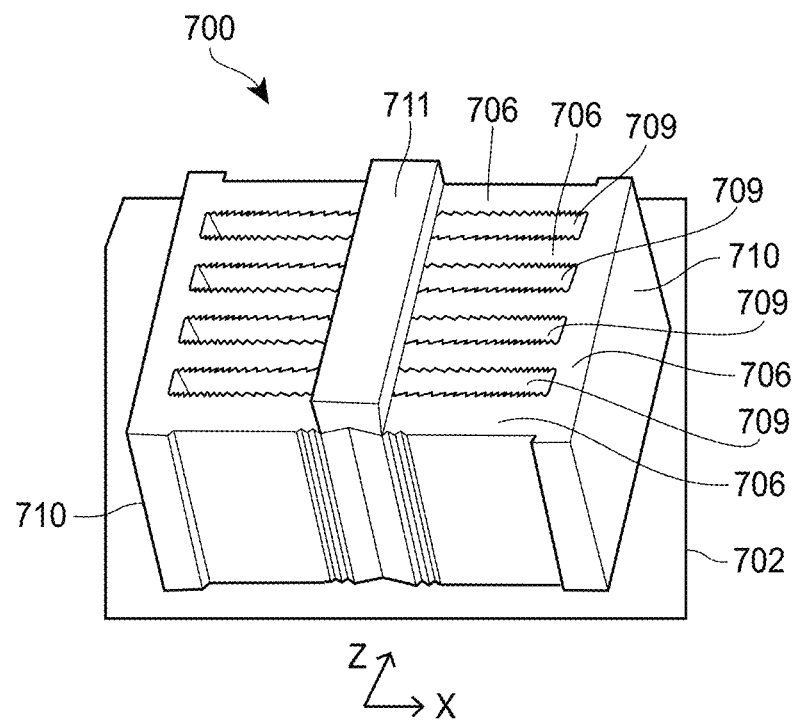
FIG. 7A is schematic diagram of an embodiment of a kinoform array.
Figure 7B:
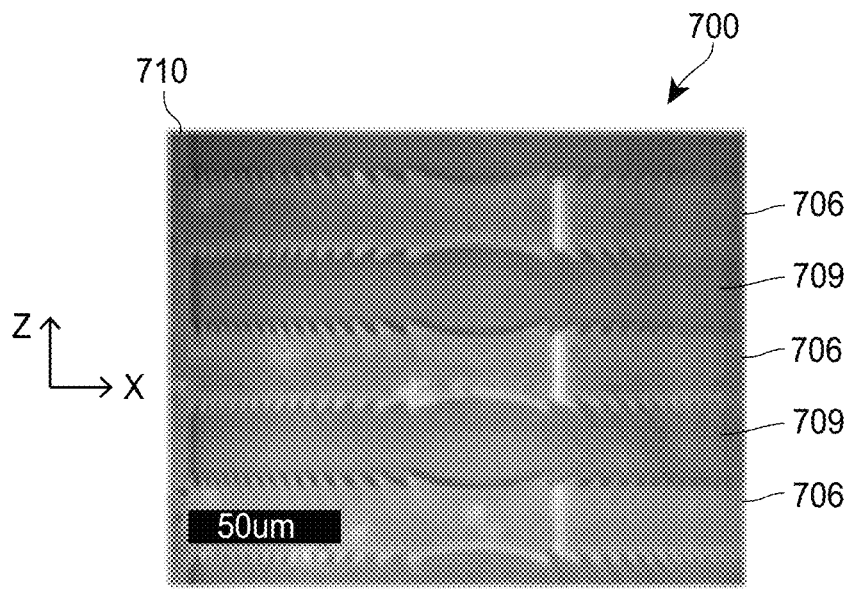
FIG. 7B is an SEM image of a fabricated kinoform array.

Refractive kinoform optics for 1D focusing have parabolic surfaces that are segmented in the transverse direction to form saw-tooth like surfaces. The saw-tooth like structures reduce the thickness of a kinoform as compared to a traditional lenses, which reduces the absorption of X-rays as the X-ray propagates through the kinoform. However, due to thin form factors of the kinoform lenses, reinforcing beams and/or walls are typically required to connect individual kinoform units to strengthen the shape and maintain the rigidity of a kinoform unit array. Due to the required walls and supporting structures, kinoform lenses can be excessively bulky for use in beam lines. FIG. 7A is an illustration of an embodiment of a kinoform array 700, and FIG. 7B is an optical microscope image of a fabricated kinoform array according to the illustration of FIG. 7A. The kinoform array 700 includes kinoform lenses 706 that are printed on a substrate 702 using MPPL as described herein. The kinoform array 700 further includes supporting walls 710 and a reinforcing beam 711. The supporting walls 710 and reinforcing beam 711 are printed during the fabrication of the kinoform lenses 706 from a same resin as the kinoform lenses 706, therefore, the supporting walls 710 and the reinforcing beam 711 are physically coupled to the kinoform lenses 706 during the MPPL fabrication. The supporting walls 710 provide structural support for the kinoform lenses 706 by flanking the kinoform lenses 706 on both sides of the kinoform lenses 706 along the horizontal direction (i.e., the X axis).

The reinforcing beam 711 is printed on top of the kinoform lenses 706 and the reinforcing beam connects the kinoform lenses 706 along the propagation axis. In the embodiments illustrated in FIG. 7A, the reinforcing beam 711 is physically coupled to the kinoform lenses 706 near the center of each kinoform lens 706 along the propagation direction (the Z-axis). In other embodiments, the reinforcing beam 711 may be physically coupled to the top of each kinoform lens 706 at a position along the propagation axis that is not near the center of each kinoform lens 706. While illustrated in FIG. 7A as a single reinforcing beam 711, multiple reinforcing beams 711 may be implemented to provide structural support for the kinoform lenses 706. Further, one or more reinforcing beams 711 may be physically coupled to the kinoform lenses with the reinforcing beam or beams 711 extending between the kinoform lenses along a direction that is not parallel to the propagation axis (e.g., diagonally across the kinoform lenses 706 from one corner of one of the supporting walls 710 to an opposite corner of the opposing support wall 710).

The kinoform lens array 700 may be considered to be a hollow optic due to hollow regions 709 of the kinoform lens array 700. The methods described may be used for fabricating other hollow lenses, hollow lens arrays, or other optics having hollow regions. As shown in FIG. 7B, the kinoform lens array 700, or similarly, another hollow lens or hollow lens array, may include walls 710 and one or more reinforcing beams 711. Together, the walls 710 and reinforcing beam 711 may be considered scaffolding. The scaffolding may support one or more optical elements while allowing for the optical element to have an open region (i.e., an open side or face of the optical element) allowing access to the hollow regions 709 of the hollow optics. The access to the open regions 709 of the kinoform lens array 700, or another hollow optic, allows for providing a coating to surfaces of the kinoform lenses 706. In embodiments, a coating may be provided to the kinoform lenses 706 by atomic layer deposition of the coating. For example, $Al_2O_3$ may be deposited on the kinoform lenses 706, or another optical structure. In embodiments, a hollow optical element may provide a structural base for a coating. After the coating is provided to a hollow optical element, the structural base (e.g., polymer or photoresist material) may be removed in an oxidizing atmosphere. The scaffolding may further provide thermal contacts for dissipating heat and may provide structural support to the hollow optic to maintain the shapes of optical elements and hollow regions of the hollow optic. Further, hollow regions of a hollow optic may themselves be configured to be lenses and/or another optical element.

The system and fabrication method described herein may be used for fabricating a phase correcting optical element, such as a phase corrective plate. Phase corrective optical elements fabricated according to the disclosed methods have a high level of surface smoothness and features are able to be printed at finer resolution than other fabrication methods allowing for improved performance for correcting the phase of a wavefront. FIG. 8A is a schematic diagram of a top-down view of a CRL lens array 800 with lenses having defects 807 on a surface of the lenses along the optical axis D. The CRL lens array 800 of FIG. 8A is configured to focus an X-ray beam one dimensionally in the horizontal direction. As an X-ray propagates through the CRL lens array 800, the X-ray beam accumulates phase distortion from the defects 807 on the lenses of the CRL lens array 800. Phase distortion can cause improper focusing, decoherence, or undesirable interference of a beam, which may render an X-ray beam useless in applications. FIG. 8B is a plot of the wavefront intensity of an X-ray beam propagating along the optical axis D near the focal plane of the CRL lens array 800 and the corresponding beam waist of the beam. The beam of FIG. 8B has been focused by a CRL lens array having lens defects. As illustrated by FIG. 8B, the beam waist of the beam is nearly 10 microns in the vertical direction.

FIG. 8C is schematic diagram of a top-down view of the CRL lens array 800 of FIG. 8A with a phase corrective plate 820 disposed along the optical axis D configured to manipulate the beam and to correct for phase errors introduced by the lenses 806 having the defects 807. The phase corrective plate 820 has a first surface 822 and a second surface 824. The first and second surfaces 822 and 824 may independently be a flat surface, concave surface, convex surface, aspherical surface, or another surface for manipulating the wavefront of an X-ray beam. In the embodiment illustrated in FIG. 8C, the first surface 822 is a flat surface, and the second surface 824 is a surface having different surface depths. The different surface depths cause different phase accumulations across a wavefront of an X-ray beam as the beam propagates through the phase corrective plate 820, which can be used to correct for the phase error due to the lenses 807 of the CRL lens array 800. The different surface depths of the second surface 824 can be determined by a phase mapping of the phase distortion of the wavefront of the X-ray beam and the phase corrector may then be printed to apply a desired phase correction. FIG. 8D is a plot of the wavefront intensity of an X-ray beam propagating along the optical axis D near the focal plane of the CRL lens array 800 having the phase corrective plate 820. As illustrated by FIG. 8D, the beam waist of the phase corrected beam is on the order of 3 to 3 microns in the vertical direction, which is a much tighter focus than achieved by the CRL lens array 800 without having the phase corrective plate 820. Therefore, an MPPL fabricated phase corrector, as disclosed herein, may provide an effective, inexpensive, and easy to install components for correcting phase distortion in current and future optical systems. Although illustrated in FIG. 8C as a 1D phase corrector, one of ordinary skill in the art would understand, using the principles described, that a 2D phase corrector may also be fabricated using the methods disclosed.

Figure 9:
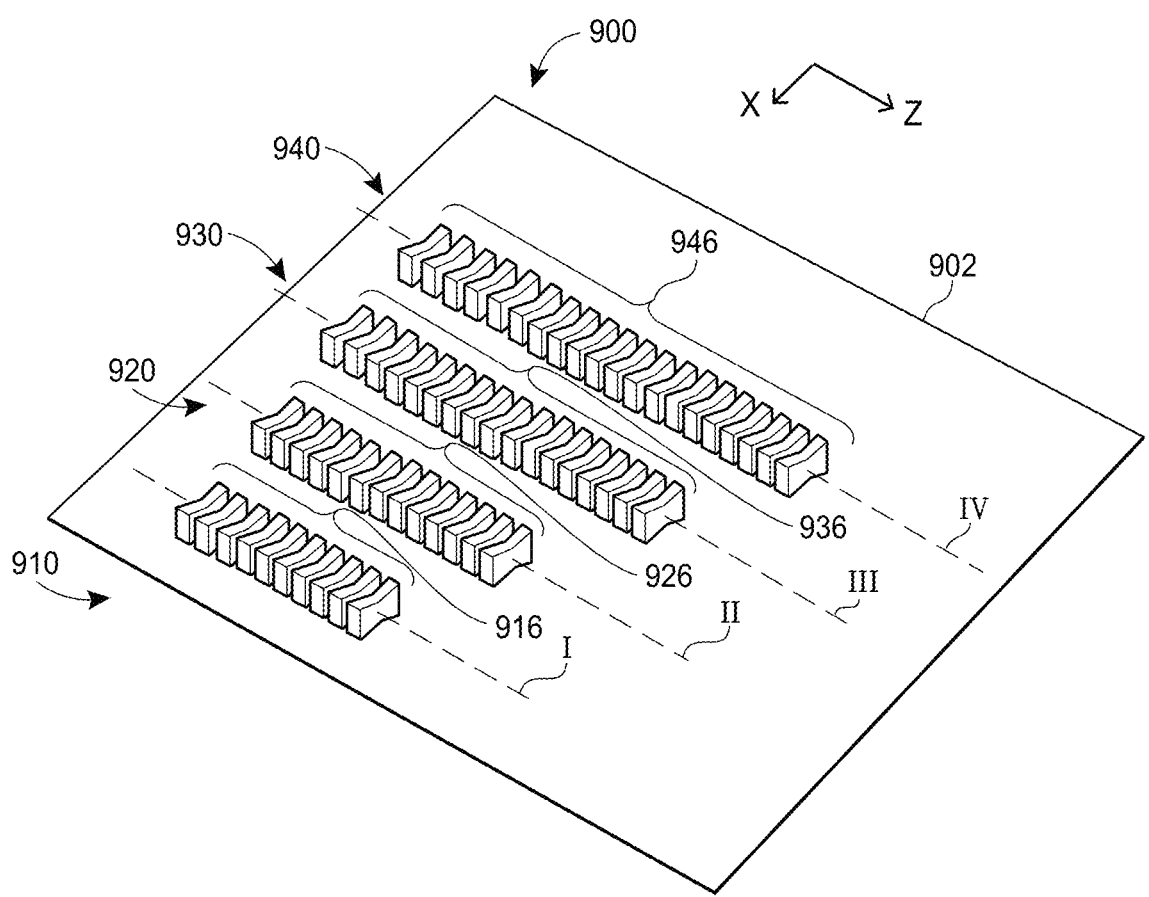
FIG. 9 is a schematic diagram of a transfocator fabricated according to the MPPL printing method of FIG. 3A.

Many X-ray beam delivery systems require that the distance of a focal plane be maintained constant while the energy of an X-ray beam is changed. Typically, this would necessitate reconfiguring lenses and optical components which can be cumbersome and require a significant amount of time. Transfocators provide a means for switching out lens arrays of a beam line for more efficiently changing the focal distance of an X-ray beam delivery system, or for maintaining a focal distance while the X-ray energy is changed. Most transfocators utilize expensive and bulky optics which often require time to physically replace and can require appreciable physical space in a beam line. FIG. 9 is a schematic diagram of a transfocator 900 fabricated according to the MPPL printing method described herein. The transfocator 900 includes four CRLs 910, 920, 930, and 940 each, respectively, having a plurality of lenses 916, 926, 936, and 946. Each lens of the pluralities of lenses 916, 926, 936, and 946 is fabricated by MPPL of a resin coating the substrate 902. Each of the CRLs, 910, 920, 930, and 940, has a respective optical axis I, II, III, and IV. Each of the CRLs 910, 920, 930, and 940 is configured to focus an X-ray beam propagating along the CRL's corresponding optical axis and each of the optical axes I, II, III, and IV are parallel. Further, each of the CRLs 910, 920, 930, and 940 may include other optical elements such as phase correctors, 1 D lenses, 2D lenses, kinoforms, or another refractive optical element.

In embodiments, mounts, such as the mounts 218 of FIG. 2, may be physically coupled to the substrate 902 to optical align the transfocator 900 and further, to translate the transfocator 900 along the horizontal axis (i.e., the X axis). Each of the CRLs 910, 920, 930, and 940 has a different focal plane distance, and therefore, changing the alignment of an X-ray beam from the optical axis of one CRL of the transfocator 900, to the optical axis of a different CRL of the transfocator 900 changes the focal distance of the focal plane of an X-ray beam delivery or beam line system. After the initial optical alignment of one CRL of the transfocator 900, fast switching of the CRLs may be performed for an X-ray system to operate at a range of different energies by simply translating the substrate 902 of the transfocator 900 without any further alignment. In a specific example, the CRLs 910, 920, 930, and 940 are each configured to focus X-ray beams having energies of 6, 7, 8, and 9 keV at a focal distance of 0.9821 m. As such, the transfocator 900 is a transfocator-on-chip which simplifies changing of the focal distance of an X-ray system that may require the use of different energies of X-rays. Further, the transfocator 900 may have any number of CRLs, and each CRL may include any number of lenses. Each of the lenses of the CRLs 910, 920, 930, and 940 may have any types of first and second surfaces as described previously herein in respect to the 1D lenses of FIGS. 4A-4D, and the 2D lenses of FIGS. 5A and 5B. Further, the CRLs 910, 920, 930, and 940 of the transfocator 900 may include phase correctors as described herein. While described as including CRLs, the transfocator 900 may include any optics for performing focusing, phase correction, wave manipulation, polarization manipulation, or another operation on a beam.

While the present invention has been described with reference to the details of the embodiments of the invention shown in the drawing, the described details are not intended to limit the scope of the invention as claimed. The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method of fabricating a refractive optical element, the method comprising: providing a substrate with a resin; providing radiation to a portion of the resin, the radiation configured to cause two photon polymerization of the resin; forming, by two photon polymerization, a first surface of a polymer refractive optical element from the resin, the first surface disposed along an optical axis of the refractive optical element and the first surface having a roughness of less than 100 nanometers; and forming, by two photon polymerization, a second surface of the polymer refractive optical element, the second surface disposed along the optical axis of the refractive optical element and the second surface having a roughness of less than 100 nanometers.

2. The method of aspect 1, wherein the substrate is one of the group consisting of: a glass substrate, an organically modified ceramic, and a photoresist.

3. The method of either of aspects 1 or 2, further comprising coating the substrate with a layer before coating the substrate with the resin, the layer having nanoparticles 4. The method of aspect 3, wherein the nanoparticles comprise at least one of indium tin oxide, boron nitride, silicon carbide, boron carbide, or aluminum nitride.

5. The method of any of aspects 1 to 4, wherein the radiation is provided by a laser.

6. The method of any of aspects 1 to 5, further comprising coating the first surface of the polymer refractive optical element with a low-Z material.

7. The method of any of aspects 1 to 6, further comprising coating the second surface of the polymer refractive optical element with a low-Z material.

8. The method of any of aspects 1 to 7, wherein the polymer refractive optical element has a thickness along the optical axis of less than 500 micrometers.

9. The method of any of aspects 1 to 8, wherein the polymer refractive optical element comprises a phase corrective plate.

10. The method of any of aspects 1 to 9, wherein the polymer refractive optical element comprises a refractive lens.

11. The method of any of aspects 1 to 10, wherein the polymer refractive optical element is a first polymer refractive optical element of a plurality of refractive optical elements and further comprising: forming a by two photon polymerization, a first surface of a second polymer refractive optical element from the resin, the first surface of the second polymer refractive optical element disposed along an optical axis of the second polymer refractive optical element and the first surface of the second polymer refractive optical element having a roughness of less than 100 nanometers; and forming, by two photon polymerization, a second surface of the second polymer refractive optical element, the second surface of the second polymer refractive optical element being along the optical axis of the second polymer refractive optical element and the second surface of the second polymer refractive optical element having a roughness of less than 100 nanometers.

12. The method of aspect 11, further comprising coating the first surface of the second polymer refractive optical element with a low-Z material.

13. The method of either of aspects 11 or 12, further comprising coating the second surface of the second polymer refractive optical element with a low-Z material.

14. The method of any of aspects 11 to 13, wherein the plurality of refractive optical elements comprises a plurality of lenses that form a compound refractive lens configured to perform one dimensional focusing of radiation.

15. The method of any of aspects 11 to 14, wherein the plurality of refractive optical elements further comprises a phase corrective plate.

16. The method of any of aspects 11 to 13, wherein the plurality of refractive optical elements comprises a plurality of lenses that form a compound refractive lens configured to perform two dimensional focusing of radiation.

17. The method of aspect 16, wherein the plurality of refractive optical elements further comprises a phase corrective plate.

18. The method of any of aspects 11 to 17, wherein the plurality of refractive optical elements comprises a transfocator.

19. The method of any of aspects 11 to 18, wherein the optical axis of the second polymer refractive optical element is collinear with the optical axis of the first polymer refractive optical element.

A. A refractive optical element comprising: a substrate, the substrate providing mechanical support for the refractive optical element; a resin deposited on a surface of the substrate; a polymer refractive optical element physically coupled to the substrate, the refractive optical element being formed by two-photon polymerization of the resin, the polymer refractive optical element having a first surface with a roughness of less than 100 nanometers and a second surface with a roughness of less than 100 nanometers with the first and second surfaces along an optical axis of the polymer refractive optical element.

A+1. The refractive optical element of aspect A, wherein the substrate is one of the group consisting of: a glass substrate, an organically modified ceramic, and a photoresist.

A+2. The refractive optical element of either of aspect A or A+1, further comprising a layer having nanoparticles.

A+3. The refractive optical element of aspect A+2, wherein the nanoparticles comprise at least one of indium tin oxide, boron nitride, silicon carbide, boron carbide, or aluminum nitride.

A+4. The refractive optical element of any of aspects A to A+3, further comprising a radiation source configured to provide radiation to the resin, the radiation configured to perform two-photon polymerization of the resin.

A+5. The refractive optical element of any of aspects A to A+4, further comprising a coating of a low-Z material disposed on the first surface of the polymer refractive optical element.

A+6. The refractive optical element of any of aspects A to A+5, further comprising a coating of a low-Z material disposed on the second surface of the polymer refractive optical element.

A+7. The refractive optical element of any of aspects A to A+6, wherein the polymer refractive optical element has a thickness along the optical axis of less than 500 micrometers.

A+8. The refractive optical element of any of aspects A to A+7, wherein the polymer refractive optical element comprises a phase corrective plate.

A+9. The refractive optical element of any of aspects A to A+8, wherein the polymer refractive optical element comprises a refractive lens.

A+10. The refractive optical element of any of aspects A to A+9, wherein the polymer refractive optical element is a first polymer refractive optical element of a plurality of refractive optical elements and further comprising: a second polymer refractive optical element physically coupled to the substrate, the second polymer refractive optical element being formed by two-photon polymerization of the resin, the second polymer refractive optical element having a first surface with a roughness of less than 100 nanometers and a second surface with a roughness of less than 100 nanometers with the first and second surfaces of the second polymer refractive optical element disposed along an optical axis of the second polymer refractive optical element.

A+11. The refractive optical element of claim A+10, further comprising a coating of a low-Z material disposed on the first surface of the second polymer refractive optical element.

A+12. The refractive optical element of either aspect A+10 or A+11, further comprising a coating of a low-Z material disposed on the second surface of the second polymer refractive optical element.

A+13. The refractive optical element of any of aspects A+10 to A+12, wherein the plurality of refractive optical elements comprises a plurality of lenses that form a compound refractive lens configured to perform one dimensional focusing of radiation.

A+14. The refractive optical element of any of aspects A+10 to A+13, wherein the plurality of refractive optical elements further comprises a phase corrective plate.

A+15. The refractive optical element of any of aspects A+10 to A+12, wherein the plurality of refractive optical elements comprises a plurality of lenses that form a compound refractive lens configured to perform two dimensional focusing of radiation.

A+16. The refractive optical element of aspect A+15, wherein the plurality of refractive optical elements further comprises a phase corrective plate.

A+17. The refractive optical element of any of aspects A+10 to A+15, wherein the plurality of refractive optical elements comprises a transfocator.

A+18. The refractive optical element of any of aspects A to A+15, wherein the polymer refractive optical element has a width of less than 500 micrometers.

A+19. The refractive optical element of any of aspects A to A+15, wherein the polymer refractive optical element has a height of less than 500 micrometers.

A+20. The refractive optical element of any of aspects A+10 to A+19, wherein the optical axis of the second polymer refractive optical element is collinear with the optical axis of the first polymer refractive optical element.

A+21. The refractive optical element of any of aspects A to A+20, further comprising: hollow regions in the refractive optical element; and scaffolding coupled to the polymer refractive optical element, the scaffolding configured to structurally support the polymer refractive optical element to maintain the shape of the hollow regions.

What is claimed is:

1. A method of fabricating an x-ray refractive optical element, the method comprising:
providing a substrate with a resin;
providing radiation perpendicular to an optical axis, to a portion of the resin, the radiation configured to cause two photon polymerization of the resin, the optical axis being parallel to the substrate;
forming, by two photon polymerization, a first surface of a polymer refractive optical element from the resin, the first surface disposed along the optical axis of the refractive optical element and the first surface having a roughness of less than 100 nanometers; and
forming, by two photon polymerization, a second surface of the polymer refractive optical element, the second surface disposed along the optical axis of the refractive optical element and the second surface having a roughness of less than 100 nanometers, wherein at least one of the first and second surfaces is configured to provide different focuses to different transverse components of a beam along the optical axis with the first surface being asymmetric to the second surface about the optical axis.

2. The method of claim 1, wherein the substrate is one of the group consisting of: a glass substrate, an organically modified ceramic, and a photoresist.

3. The method of claim 1, further comprising coating the substrate with a layer before coating the substrate with the resin, the layer having nanoparticles.

4. The method of claim 3, wherein the nanoparticles comprise at least one of indium tin oxide, boron nitride, silicon carbide, boron carbide, or aluminum nitride.

5. The method of claim 1, wherein the radiation is provided by a laser.

6. The method of claim 1, wherein the polymer refractive optical element has a thickness along the optical axis of less than 500 micrometers.

7. The method of claim 1, wherein the polymer refractive optical element comprises a phase corrective plate.

8. The method of claim 1, wherein the polymer refractive optical element comprises a refractive lens.

9. The method of claim 1, wherein the polymer refractive optical element is a first polymer refractive optical element of a plurality of refractive optical elements and further comprising:

forming a by two photon polymerization, a first surface of a second polymer refractive optical element from the resin, the first surface of the second polymer refractive optical element disposed along an optical axis of the second polymer refractive optical element and the first surface of the second polymer refractive optical element having a roughness of less than 100 nanometers; and forming, by two photon polymerization, a second surface of the second polymer refractive optical element, the second surface of the second polymer refractive optical element being along the optical axis of the second polymer refractive optical element and the second surface of the second polymer refractive optical element having a roughness of less than 100 nanometers.

10. The method of claim 9, wherein the plurality of refractive optical elements comprises a plurality of lenses that form a compound refractive lens configured to perform two dimensional focusing of radiation.

11. The method of claim 9, wherein the plurality of refractive optical elements comprises a transfocator.

12. An x-ray refractive optical element comprising:
a substrate, the substrate providing mechanical support for the refractive optical element;
a resin deposited on a surface of the substrate; and
a polymer refractive optical element physically coupled to the substrate, the refractive optical element being formed by two-photon polymerization of the resin, the polymer refractive optical element having a first surface with a roughness of less than 100 nanometers and a second surface with a roughness of less than 100 nanometers with the first and second surfaces along an optical axis of the polymer refractive optical element, the optical axis being parallel to the substrate, and the polymer refractive optical element being configured to provide different focuses to transverse components of a beam propagating along the optical axis with the first surface being asymmetric to the second surface about the optical axis.

13. The refractive optical element of claim 12, wherein the substrate is one of the group consisting of: a glass substrate, an organically modified ceramic, and a photoresist.

14. The refractive optical element of claim 12, wherein the polymer refractive optical element has a thickness along the optical axis of less than 500 micrometers.

15. The refractive optical element of claim 12, wherein the polymer refractive optical element comprises a phase corrective plate.

16. The refractive optical element of claim 12, wherein the polymer refractive optical element comprises a refractive lens.

17. The refractive optical element of claim 12, wherein the polymer refractive optical element is a first polymer refractive optical element of a plurality of refractive optical elements and further comprising:
a second polymer refractive optical element physically coupled to the substrate, the second polymer refractive optical element being formed by two-photon polymerization of the resin, the second polymer refractive optical element having a first surface with a roughness of less than 100 nanometers and a second surface with a roughness of less than 100 nanometers with the first and second surfaces of the second polymer refractive optical element disposed along an optical axis of the second polymer refractive optical element.

18. The refractive optical element of claim 17, wherein the plurality of refractive optical elements comprises a plurality of lenses that form a compound refractive lens configured to perform two dimensional focusing of radiation.

19. The refractive optical element of claim 17, wherein the plurality of refractive optical elements comprises a transfocator.

20. The refractive optical element of claim 12, further comprising:
hollow regions; and
interior scaffolding coupled to the polymer refractive optical element, the scaffolding configured to structurally support the polymer refractive optical element to maintain the shape of the hollow regions.

* * * * *